United States Patent [19]
Oudet

[11] Patent Number: 6,087,827
[45] Date of Patent: Jul. 11, 2000

[54] INCREMENTAL SENSOR OF SPEED AND/OR POSITION FOR DETECTING LOW AND NULL SPEEDS

[75] Inventor: Claude Oudet, Besancon, France

[73] Assignee: Moving Magnet Technologies S.A., Besancon, France

[21] Appl. No.: 09/097,587

[22] Filed: Jun. 16, 1998

Related U.S. Application Data

[63] Continuation-in-part of application No. 08/530,723, Sep. 15, 1995, Pat. No. 5,814,985.

[30] Foreign Application Priority Data

Sep. 16, 1994 [FR] France ................................. 94 11078
Jun. 19, 1995 [FR] France ................................. 95 07306

[51] Int. Cl.⁷ .............................. G01B 7/14; G01B 7/30; G01R 33/06; H01L 43/06; B23K 76/00
[52] U.S. Cl. ................................. 324/207.12; 324/207.2; 219/121.68
[58] Field of Search ............................ 324/207.2, 207.12, 324/174, 235, 251; 338/32 H; 219/121.68, 121.69, 121.67

[56] References Cited

U.S. PATENT DOCUMENTS 5,916,459   6/1999   Schroeder et al. ................. 219/121.66

*Primary Examiner*—Walter E. Snow
*Attorney, Agent, or Firm*—Oblon, Spivak, McClelland, Maier & Neustadt, P.C.

[57] ABSTRACT

This invention pertains to an incremental sensor of position and/or speed, of the type which includes a moving component made of a soft material that has at least one moving tooth in a direction OZ with respect to a permanent magnet magnetized along the direction OY, which is approximately perpendicular to the OZ axis, and a probe which is sensitive to the direction and strength of the magnetic field, such as a Hall-effect gaussmeter, arranged in the air gap between the magnet and the tooth of the moving component so that its axis of greatest sensitivity is approximately oriented along the OZ axis. The Hall-effect gaussmeter is located near a singular point of the OZ axis where the average value of the magnetic field is weak and preferably less than ±20 mT and approximately equal to the average value of the alternating field of the integrated circuit connected to the Hall-effect gaussmeter. The permanent magnet can also be laser trimmed to achieve the desired operation in the Hall-effect gaussmeter.

20 Claims, 10 Drawing Sheets

INCREMENTAL SENSOR OF SPEED AND/OR POSITION FOR DETECTING LOW AND NULL SPEEDS

CROSS-REFERENCE TO RELATED APPLICATIONS

The present application is a Continuation-In-Part of U.S. application Ser. No. 08/530,723, the contents of which are incorporated herein by reference, filed Sep. 15, 1995 now U.S. Pat. No. 5,814,985.

BACKGROUND OF THE INVENTION

1. Field of the Invention

This invention pertains to an incremental speed and/or position sensor which utilizes a probe which is sensitive to the direction and amplitude of a magnetic field, a Hall-effect gaussmeter for example, for the detection of speed and/or position, which is capable of detecting speeds down to a low value corresponding to a null speed, and which can implement a laser trimming operation to enhance operation in the sensor.

2. Discussion of the Background

The magnetic probe delivers an electric signal as a function of the magnetic field crossing it. The state-of-the-art speed sensors are designed in such a manner that the displacement of a moving component will cause a variation of the magnetic field. Subsequently in the description we will use the term "Hall-effect gaussmeter" to designate a sensor which is sensitive to the direction and amplitude of the magnetic field, which provides an electric signal as a function of the direction and amplitude of the magnetic field crossing it, without this term having to be interpreted in any restrictive way.

The first type of Hall-effect sensor includes a moving component with an alternation of north and south magnetic poles. The Hall-effect gaussmeter is connected to an electronic circuit with a logical output, which assumes a first state when the comparison unit located at the output of the Hall-effect gaussmeter provides a signal greater than a positive predetermined threshold, and a second state when the Hall-effect gaussmeter provides a signal lower than a negative predetermined threshold. Such a device is described, for example, in the French patent FR 2,648,914. Such sensors are sensitive to different external disturbances, and the dimensions of the moving component are limited by its cost.

Another type of Hall-effect sensor is comprised of a toothed moving component made of a soft magnetic material, a permanent magnet and a Hall-effect gaussmeter placed between the toothed surface of the moving component and the permanent magnet. Such sensors are, for example, described in the certificate of use American patent U.S. Pat. No. 5,250,925. Such sensors are poorly adapted for the use of a toothed surface with small amount of pitch. In order to reduce the detection pitch it is therefore necessary to move the magnet closer to the toothed surface, which creates mechanical constraints which are difficult to adhere to during fabrication of very great numbers of devices.

Such sensors are particularly poorly adapted for the detection of low speeds, even more so for the detection of position, because of the average increased value of the field with respect to the amplitude of its modulation. This average value and its conversion to an electric signal exhibits great sensitivity to various tolerances which are difficult to control or to compensate for, especially:

the B(H) characteristics of the magnet in the second quadrant;

tolerances of the magnet dimensions;

the coefficients of residual induction temperature Br and of the coercive field Hc of the magnet;

more or less good saturation of the magnet during magnetization;

tolerances for the geometry of the teeth arrangement;

the distance between the magnet and the teeth;

tolerances for the position of the Hall-effect gaussmeter;

offset and different coefficients at temperature of the Hall-effect gaussmeter.

In the description which follows "YOZ plane" will designate the plane of symmetry of the teeth of the moving component. OY will designate the direction of displacement of the moving component. O will designate the point on the envelope of the teeth tips located on the right side which pass over the center of the Hall-effect gaussmeter and of the magnet. When the moving component is a toothed wheel the center O' of the toothed wheel is located on the OX axis.

The XOZ plane will designate the plane of symmetry of the tooth, or of the tooth hollow space located opposite the Hall-effect gaussmeter and the permanent magnet. OZ designates the axis which passes by the Hall-effect gaussmeter, the magnet and the toothed surface. OX is generally a radial axis.

In the case of a rotating sensor, XOY is a plane which is tangential to the surface of a toothed wheel which comprises the moving component, and OX is generally an axis which is parallel to the generatrix of the teeth.

In the case of a linear sensor, XOY is the central plane of the toothed surface.

The electronic circuit which processes the signal provided by the Hall-effect gaussmeter, arranged in order to detect the ingredient of the field along OZ, can include a comparison unit which is sensitive to the amplitude of the signal which has a constant sign, with the aforementioned disadvantages regarding fluctuations of its average value. But most frequently the electronic circuit will include a high-pass filter in front of the comparison unit which eliminates the average value of the signal in order to allow only its modulation to pass through. Without this filter, the modulation could be sufficient without the comparison unit being activated.

Within the state of the art there has been a suggestion to remedy the disadvantages which occur at low speed, or the impossibility of functioning as a position detector by different solutions which have not turned out to be totally satisfactory.

A first solution is described in the patent PCT WO 87/06348 pertaining to a sensor which detects not only variation of a magnetic field, but also its average value, which requires the use of a filter which does not function at very low speeds. Even for a speed which suddenly reaches an increased value the filter only gives the average value at the end of several measurement periods. Therefore there might be some detection errors at the start.

A second solution, which is described in the patent BE 0,363,512, consists of utilizing two Hall-effect gaussmeters to generate a differential sensor.

These two solutions require complex electronic circuits, or large area silicon chips, which greatly increase the cost of the sensors, particularly in the case when one is using a differential sensor.

A third solution is described in the American patent U.S. Pat. No. 4,481,469 which describes a sensor which detects the tangential component of the field along the OY axis. This component changes sign during displacement by a value corresponding to one pitch, and its average value is zero. This solution admittedly allows one to partially make up for the disadvantages of the sensors conforming to the two preceding solutions. However, such a sensor is no longer completely satisfactory. The amplitude of the component of the magnetic field detected by the Hall-effect gaussmeter is weak, especially near the magnet. In addition, after the Hall-effect gaussmeter is placed in the XOZ plane and is no longer in a plane parallel to XOY, the distance between the magnet and the teeth must be increased with respect to the other solutions. This increase of the distance also has an unfavorable impact on the amplitude of the detected view, and the sensor is for this reason sensitive to parasitic magnetic fields.

Other solutions pertain to sensors in which the Hall-effect gaussmeter is placed opposite a slit provided in a metallic part. The patent U.S. Pat. No. 5,321,355 pertains to a position sensor which utilizes a Hall-effect gaussmeter. The Hall-effect gaussmeter is arranged in proximity of a metallic strip which has a slit. In the sensor, according to this technological level, the slit provided in the metal strip is intended to convert the increased induction of the permanent magnet to a weak induction which is compatible with a Hall-effect gaussmeter.

The state of the art techniques also include the German patent DE 3,638,622 in which the Hall-effect gaussmeter is in the channel of a ring-shaped magnet. A ring-shaped magnet creates a field that has a null field zone arranged approximately on the central axis of the magnet at a point localized on the external area of the ring-shaped magnet. This point is, moreover, more distant with respect to the frontal plane of the ring-shaped magnet since the diameter of the central channel is large and the magnet is short. For example, for a 10 mm diameter magnet, 4 mm in length, the singular point is at 1.2 of the frontal plane for a diameter less than 6 mm, and by 0.6 mm more for a 3 mm diameter. This diameter is already too small to allow economic implementation over a length of 4 mm. It is also quite disadvantageous to remove the mass of the magnet from the OZ axis on which one can produce maximum modulation; but this is inevitably produced with tubular magnets of the prior state of the art. In other words one must reduce, insofar as possible, the volume of the hole with respect to the volume of the magnet, which is far from the case in existing devices. In magnet sensors and Hall-effect gaussmeters there is great interest in using Hall-effect gaussmeters which are as thin as possible in order to reduce the air gap between the magnet and the toothed surface, for example the Ashl HZ106C which has a total thickness of 0.6 mm and whose sensitive surface is 0.2 mm from the lower side. The point of the null field being arranged too far from the side of the magnet, the Hall-effect gaussmeter must be moved further from the magnet which requires an increase of the air gap and causes a reduced sensitivity of the sensor. The sensor according to this state of the art is therefore not compatible with practically feasible miniaturization. In addition, control of the exact position of the Hall-effect gaussmeter with respect to the cancellation zone of the field component along OZ is extremely delicate when the field gradient is increased, and this control is hardly compatible with the proposed devices.

The patent U.S. Pat. No. 5,210,489 of the prior art describes a device which includes a magnet that has a threshold whose purpose is to homogenize the field and to make the flux lines parallel. Homogenization of the homogeneous field zone is a goal which is fundamentally different from that of the present invention, in which we are looking for a null field in the zone in which the Hall-effect gaussmeter is placed.

SUMMARY OF THE INVENTION

The object of the present invention is to remedy the disadvantages of sensors according to the different solutions of the state of the art by proposing a miniature sensor with low manufacturing cost, which would allow detection of null speeds (functioning as a position sensor), which is barely sensitive to the parasitic magnetic fields due to the use of a certain kind of geometry which produces a magnetic field that varies in sign and by amplitude to a sufficient degree, and which uses the smallest possible number of parts.

For this purpose the sensor in accordance with the invention pertains to an incremental sensor of position and/or speed of the type which includes a moving component made of a soft material that has at least one moving tooth in a direction parallel to OY compared with a permanent magnet that is magnetized along a direction OZ which is approximately perpendicular to the OY axis, and a probe which is sensitive to the direction and strength of a magnetic field, such as a Hall-effect gaussmeter, arranged in the air gap between the magnet and the tooth of the moving component so that its axis of greatest sensitivity is approximately oriented along the OZ axis, characterized in that the Hall-effect gaussmeter is located near a singular point of the OZ axis (null field point) at a point where the average value of the magnetic field along OZ during displacement of the moving component is approximately equal to the field which causes oscillation of the electronic circuit that processes the signal delivered by the Hall-effect gaussmeter.

This oscillating value of the integrated electronic circuit connected to the probe corresponds to a weak field, almost zero, and depends on the selected integrated circuit. Its absolute value is preferably between 0 and 20 mT, particularly between 0 and 8 mT.

The Hall-effect gaussmeter is placed outside the volume defined by the magnet so as to permit miniaturization of the sensor and particularly of the hole of the magnet.

The plane of the Hall layer of the Hall-effect gaussmeter is placed between the plane that passes by the front side of the magnet, which is closest to the moving component, and the parallel plane tangential to the moving component, at a distance from the frontal plane of the magnet at least equal to the thickness of the protective envelope of the Hall layer.

The magnet has a cavity located in the vicinity of the axis perpendicular to the displacement axis of the moving component that passes by the Hall-effect gaussmeter.

By "tooth" in the sense of the present patent we mean any shape which can produce a variable air gap along the OZ axis. This profile can be regular or not, concave or convex, projecting with respect to a generally regular surface, or formed by a notch.

According to a first variant, the cavity is a very small diameter hole which crosses through the permanent magnet.

According to another variant, the magnet is comprised of a magnet with a perforated disk shaped at least partially by a coaxial cylindrical cavity.

Preferably, the Hall-effect gaussmeter is positioned on the z ordinate on the OZ axis, such as the induction defined by the following relationship:

$$B_{total}/B_r = B_{solid\ magnet}/B_r - B_{virtual\ magnet}/B_r + B_{plug\ magnet}/B_r$$

or approximately equal to the average oscillation value of the integrated electronic circuit connected to the Hall-effect gaussmeter when the air gap increases,
where:

$B_{total}$ is the component of induction along OZ the origin O of the axes, the beginning from which the distance z is measured, is located on the side of the magnet opposite the teeth;

$B_r$ designates the residual induction;

$B_{solid\ magnet}$ designates the induction of an unperforated virtual magnet, especially a cylindrical one, of which the external dimensions correspond to the external dimensions of the permanent magnet;

$B_{virtual\ magnet}$ designates the induction of a virtual magnet whose external dimensions correspond to the internal dimensions of the cavity;

$B_{plug\ magnet}$ designates the induction of a virtual magnet in which the section corresponds to the internal section of the cavity, and in which the height corresponds to the difference between the actual magnet and the depth of the cavity.

According to another preferred variant, the Hall-effect gaussmeter is positioned on the ordinate z on the OZ axis so that the induction:

$$B_{alternating}/B_r \cong \frac{1}{2}\left[\frac{z+2L}{\sqrt{R^2+(z+2L)^2}} - \frac{z}{\sqrt{R^2+z^2}} - \frac{z+2L}{\sqrt{r^2+(z+2L)^2}} + \frac{z}{\sqrt{r^2+z^2}} + \frac{(z+2l)}{\sqrt{r^2+(z+2l)^2}} - \frac{z}{\sqrt{r^2+z^2}}\right]$$

where:

$B_{alternating}$ designates the value of the alternating field of the integrated circuit which processes the signal of the Hall-effect gaussmeter;

l designates the difference between the thickness of the magnet and the depth of the cavity (l is null in the case of an air gap which crosses the magnet);

L designates the thickness of the magnet in the case in which the magnet is connected to a large size yoke, the yoke then playing the role of magnetic reflector. If the magnet is not connected to a yoke, the thickness of the magnet is 2L;

z designates the ordinate of the Hall-effect gaussmeter measured from an origin located on the side of the magnet opposite the teeth;

R designates the external radius of the magnet;

r designates the radius of the cavity or of the cylindrical air gap.

According to a first mode of implementation for detection of rotating displacements, the moving component is a toothed wheel.

According to a second mode of implementation for detection of linear displacement, the moving component is a rack.

Preferably, the transverse dimensions of the air gap which cross the magnet are between 0.8 and 1.8 mm, preferably between 0.8 and 1.3 mm.

Preferably, the shape of the magnet will correspond to the shape of the teeth. A set of teeth with rectangular shape will be adapted to a rectangular magnet.

According to a preferred mode of implementation the magnet, the Hall-effect gaussmeter and the associated electronic circuits are integrated in a housing made of plastic made by cast molding. This mode of implementation allows one to precisely position the probe with respect to the magnet and to increase the play between this cast molded assembly and the toothed wheel because of the reduced thickness or of the absence of plastic between the Hall-effect gaussmeter and the magnet.

BRIEF DESCRIPTION OF THE DRAWINGS

The invention will be better understood by reading the description which follows, with reference to the attached drawings in which.

DESCRIPTION OF THE PREFERRED EMBODIMENTS

Figure 1:
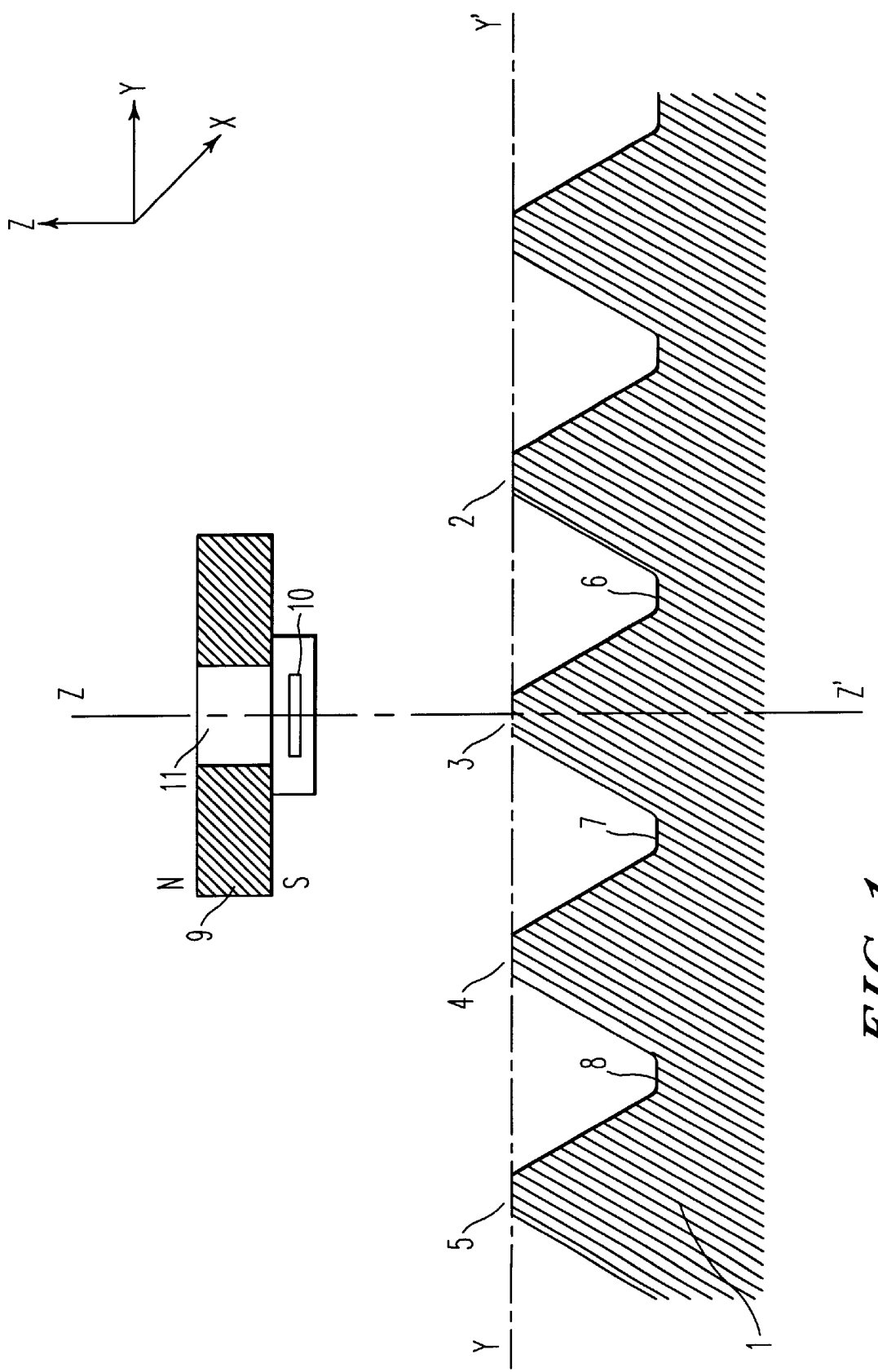
FIG. 1 represents a schematic view of the moving component.

FIG. 1 represents a schematic view of the sensor in a mode of implementation for detecting speed and angular position.

The sensor includes a toothed wheel (1) which has a large number of teeth (2, 3, 4, 5) and of intervening holes (6, 7, 8). The wheel (1) is made of a soft magnetic material.

The sensor also includes a magnet (9) magnetized along the ZOZ' radial direction. The magnet therefore has one of its poles directed in the direction of the toothed wheel (1) and the other pole in the opposite direction. A Hall-effect gaussmeter (10) is arranged on the ZOZ' axis, between the toothed wheel (1) and the permanent magnet (9).

The magnet (9) is a disk-shaped magnet of diameter D and of thickness L. By way of example the magnet is of the Samarium-cobalt type having a diameter of 7 mm and a thickness L of 2 mm.

The magnet (9) is perforated with a circular air gap (11) having a diameter of 1.4 mm.

The average distance between the top of a tooth and the magnet is 1.6 mm and the height of the teeth is on the order of 3.5 mm.

Figure 2:
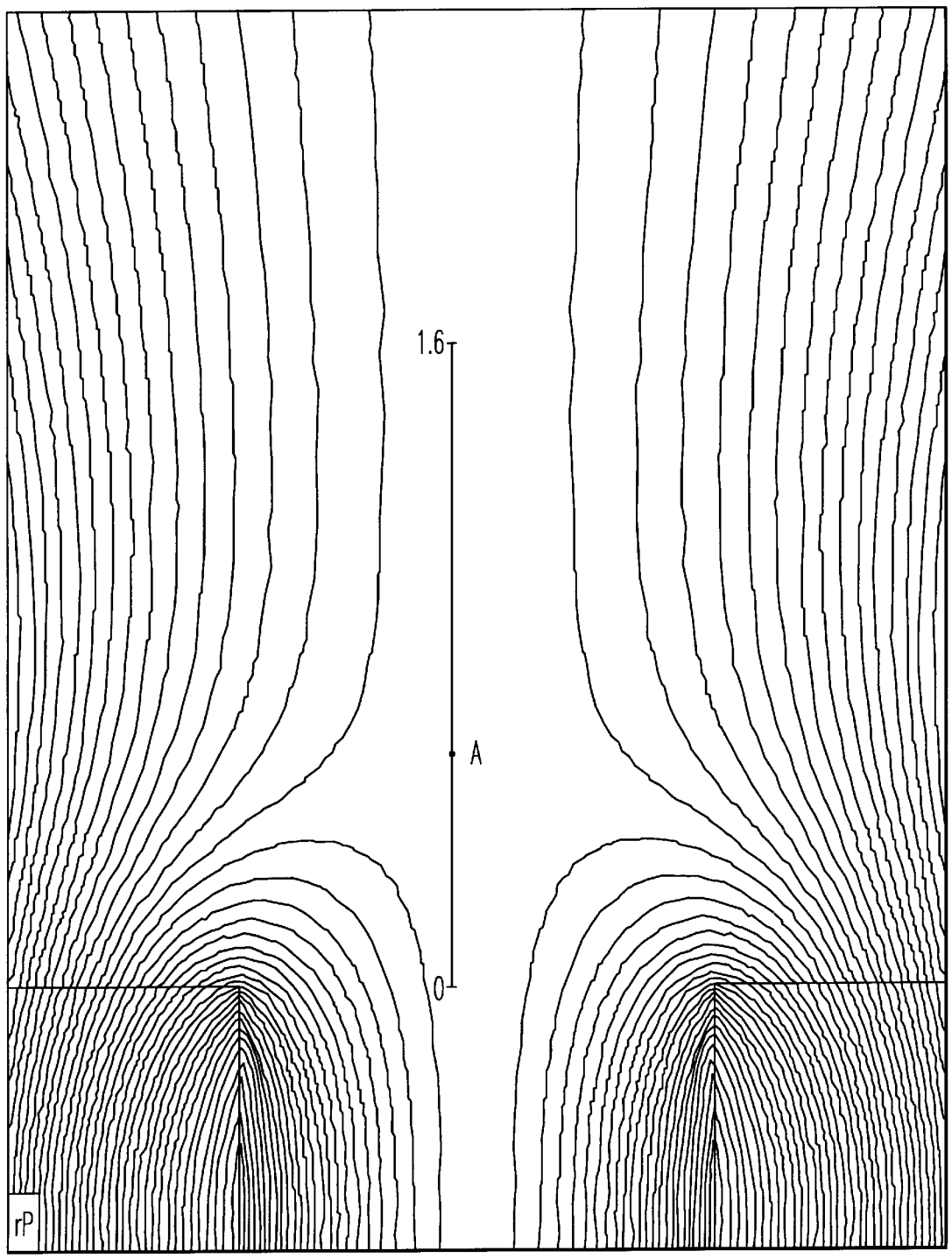
FIG. 2 represents a view of the field distribution in the YOZ plane in the vicinity of the air gap which is made in the magnet in the absence of teeth.

FIG. 2 represents a simulation of the field distribution in the vicinity of the air gap (11) of the disk-shaped magnet (9). On the ZOZ' axis, the field changes sign from one side to another at a singular point A.

Figure 3:
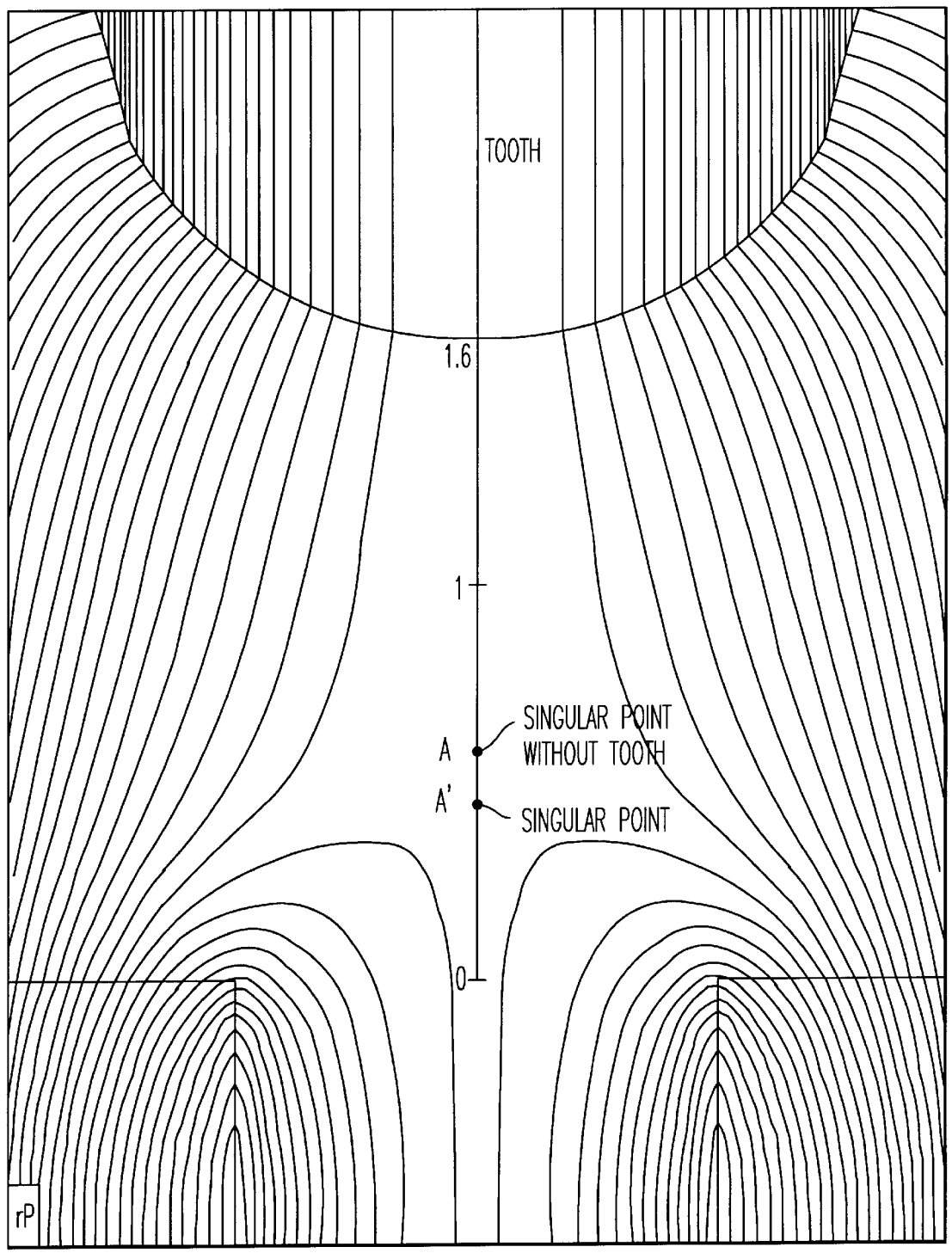
FIG. 3 represents a view of the field distribution in the YOZ plane in the vicinity of the air gap made in the magnet in the presence of a tooth.

FIG. 3 shows the field distribution in the same area with a tooth remote from the magnet (9) by 1.5 mm. The singular point A' is closer to the magnet (9) than in the preceding situation.

The Hall-effect gaussmeter (10) is preferably placed in the zone between the singular point A corresponding to the absence of a tooth, and the singular point A' corresponding to the presence of a tooth. For this reason the Hall-effect gaussmeter will detect a variation of field sign during displacement of the moving component, during the occurrence of teeth of the toothed wheel (1).

The field variation detected by the Hall-effect gaussmeter (10) will vary about a null value because of perforation of the magnet (9) which results in a field distribution in which the direction of the detected field changes sign according to the position of the tooth.

Figure 4:
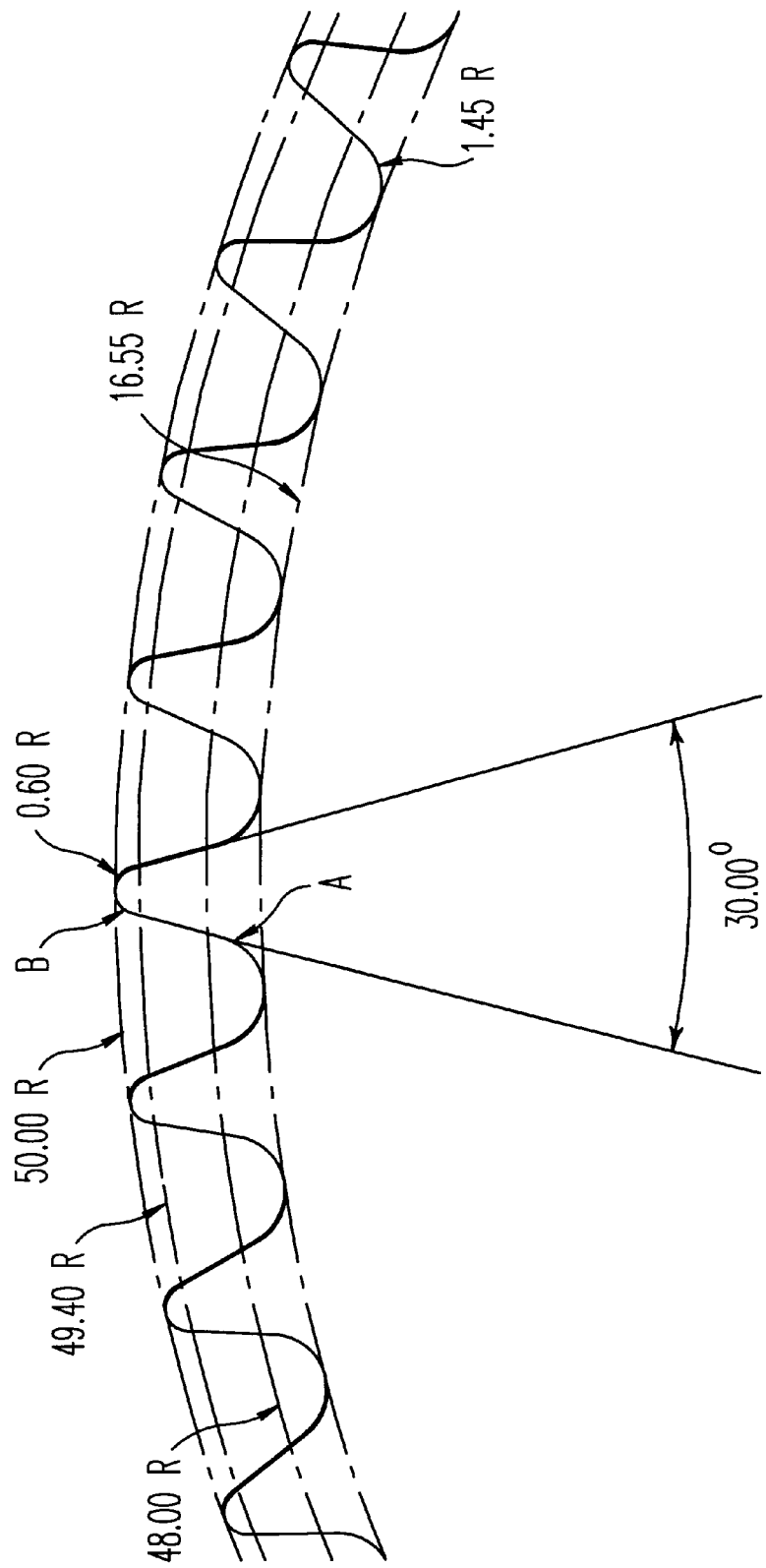
FIG. 4 represents a detailed view of the teeth of the wheel.

FIG. 4 represents a detailed view of the teeth.

The angle formed by the two sides of the teeth is approximately 30°. The width of the toothed peak is on the order of 1.5 mm, or approximately 30% of the pitch. The average radius of the wheel is 48 mm, the radius of the external envelope of the teeth is about 50 mm and the radius of the envelope of hollow areas is 46.55 mm. The wheel has 58 or 59 identical teeth and an unnotched zone extending along an arc of a circle corresponding to the position occupied by one or two teeth. This gap comprises a positioning reference point.

Figure 5:
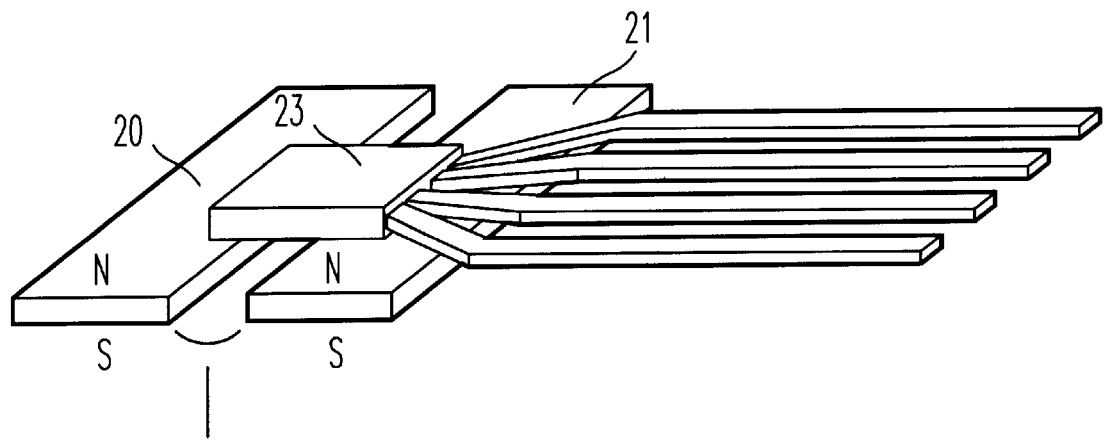
FIG. 5 represents a perspective view of another mode of implementation of the magnet.

FIG. 5 represents a perspective view of another mode of implementation of the magnet. The solution according to this mode of implementation utilizes two magnets (20, 21) which are arranged in parallel, magnetized parallel to the ZOZ' axis. The Hall-effect gaussmeter (23) is glued to the two magnets (20, 21), spanning an interval (22) provided between the two magnets (20, 21). This mode of implementation allows one to provide a very small interval between the two magnets, therefore to bring the singular point sufficiently close to the surface of these magnets.

Figure 6:
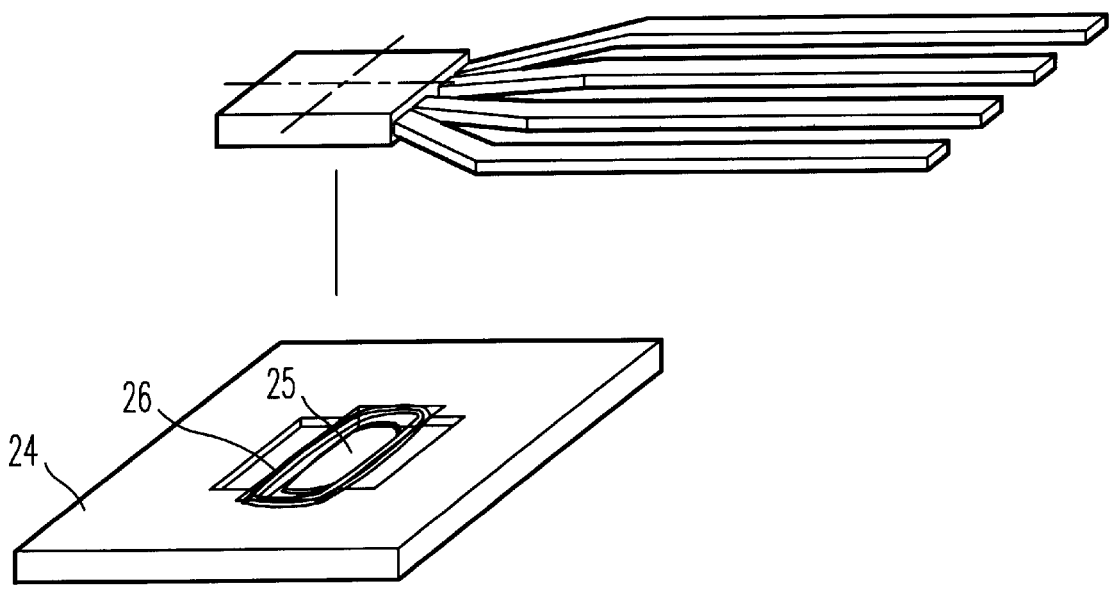
FIG. 6 represents a view of a third mode of implementation of the magnet.

FIG. 6 represents a view of a third mode of implementation of the magnet. The magnet (24) has a parallel-piped shape. It has an air gap (25) that is circular in cross section. The magnet (25) also has housings (26) for positioning the Hall-effect gaussmeter or the integrated circuit which incorporates this probe. The Samarium-cobalt magnet with a plastic binder is molded with a stamp, by injection or compression, which allows one to economically obtain the shape of the desired air gap and to produce an electrically insulated magnet. The magnet comprises the support of the "silicon chip" of the Hall-effect gaussmeter, the assembly being cast with a resin.

Figure 7:
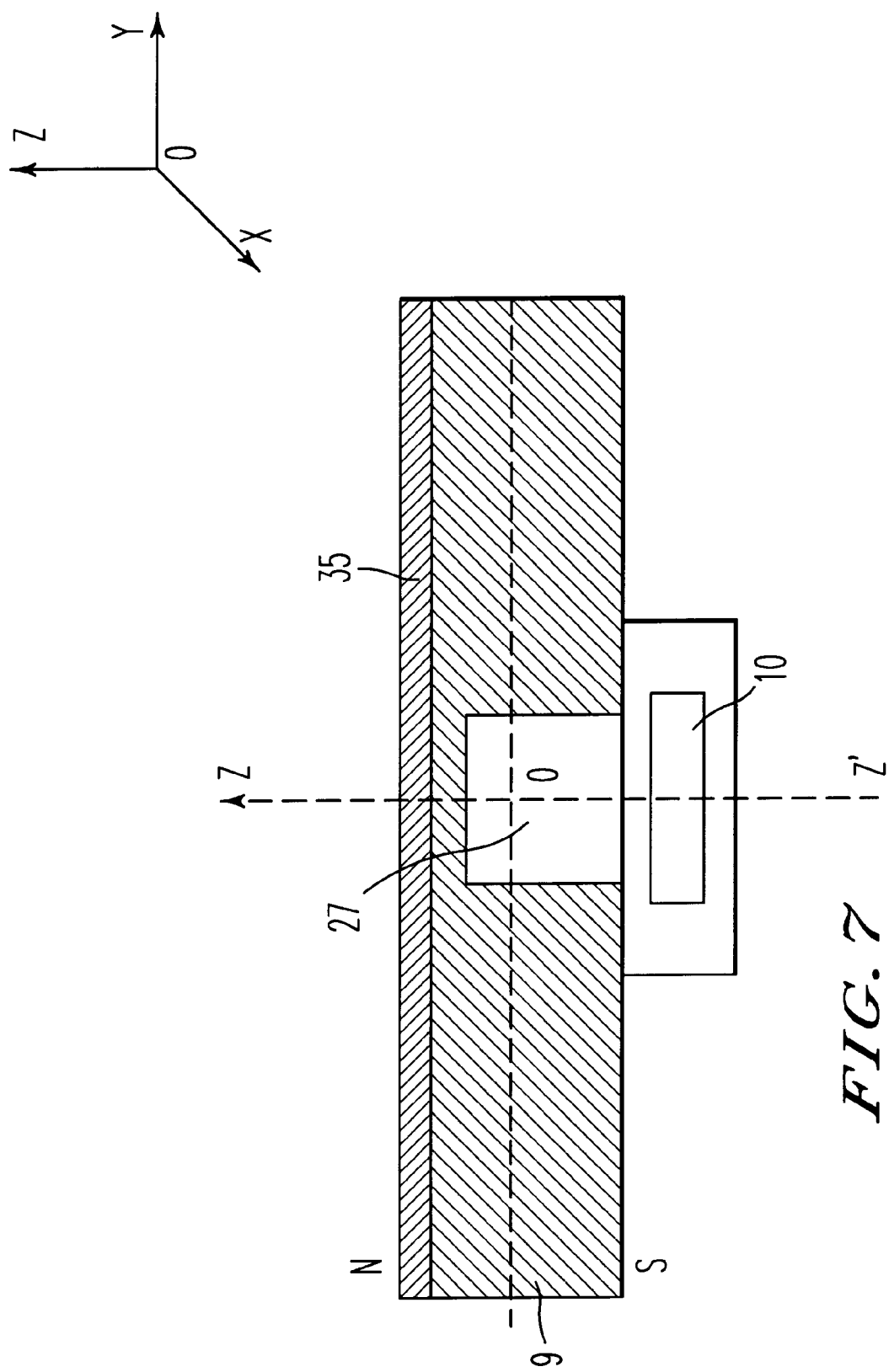
FIG. 7 represents a sectional view of a fourth mode of implementation.

FIG. 7 represents a sectional view of a fourth mode of implementation.

The magnet (9) is comprised of a disk with radius R that is 4.5 mm long and with a thickness L of 1.3 mm. The magnet is of the metal or plastic binder type, such as samarium-cobalt 1/5, (for example, commercially available magnets under the trade name Vacomax 145 or 65K made by the VACUUMSCHMELTZE company) or 2/17 or neodymium-iron-boron, (for example, magnets commercially available under the trade name NEOFER 55/100p made by the MAGNETFABRIK company, BONN).

The magnet has a coaxial cylindrical cavity (27) with radius r of 0.5 mm and a depth p of 0.6 mm. The volume occupied by the cavity (27) represents approximately 1.2% of the total volume of the magnet (9). This cavity can be made by molding or by any boring or grinding process.

The Hall-effect gaussmeter (10) is placed on the OZ axis perpendicular to the median plane (28) of the magnet (9) at a distance z equal to approximately 0.2 mm measured from the origin O.

A yoke (35) is glued to the magnet (9). This yoke (35) is formed by a cylindrical plate made of a soft magnetic material with high magnetic permeability. The assembly formed by the magnet (9), the Hall-effect gaussmeter (10), the integrated circuit and the yoke (35) are encapsulated in an epoxy resin, one part of the yoke jutting out and provided with a hole for attachment.

Figure 8:
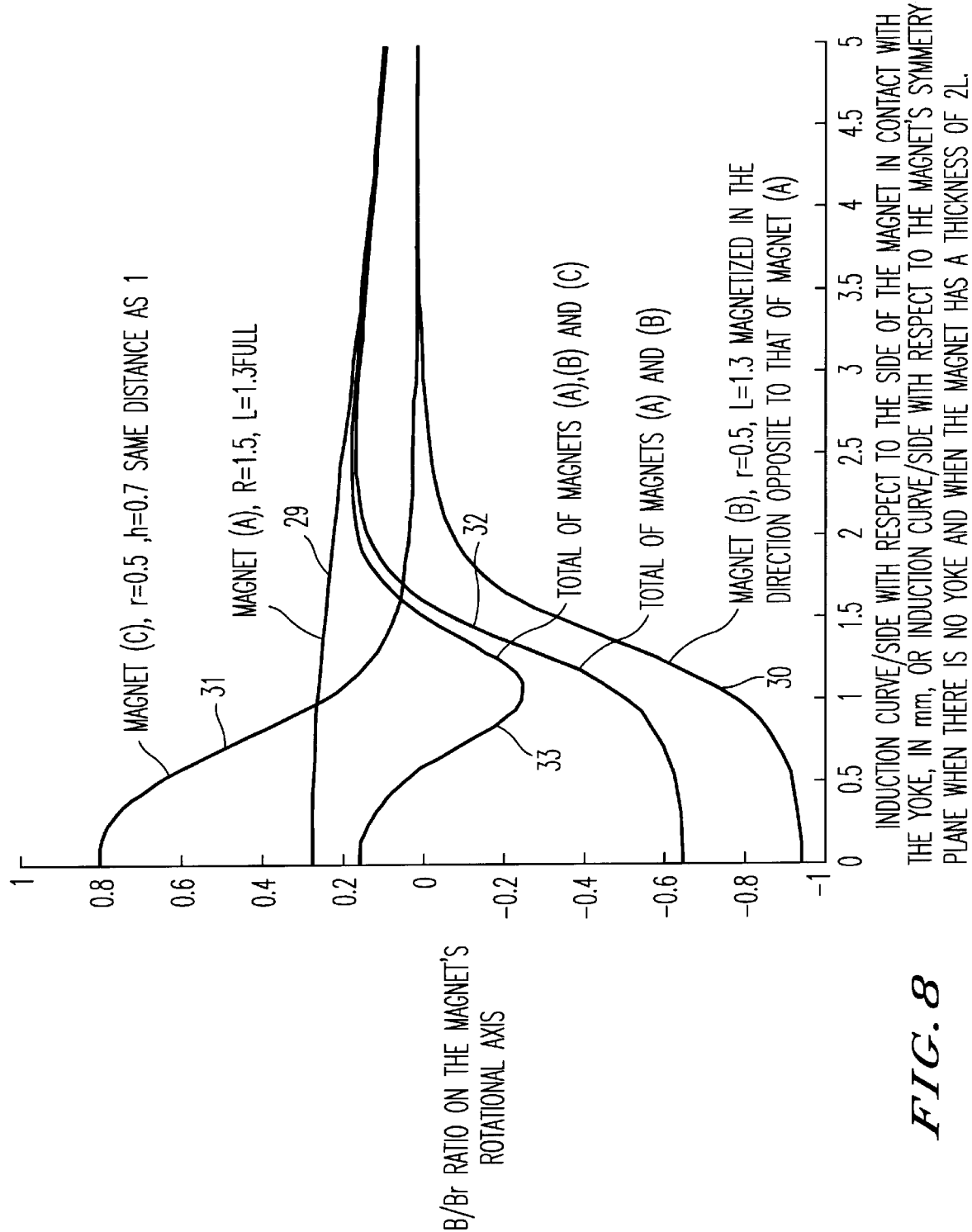
FIG. 8 represents the induction curve/distance of the magnet which is used in the fourth mode of implementation.

FIG. 8 represents the induction curve/side with respect to the side of the magnet in contact with the yoke which is used in the fourth mode of implementation.

The curve (29) represents a variation of $B/B_r$, as a function of the distance from the side of the magnet in contact with the yoke, of a magnet formed by a solid cylinder of radius R and thickness L.

The curve (30) represents a variation of $B/B_r$, as a function of the distance from the side of the magnet in contact with the yoke, of a virtual magnet formed by a solid cylinder of radius r and of thickness L magnetized in the direction opposite that of magnet (9).

The curve (32) represents a variation of $B/B_r$, as a function of the distance from the side of the magnet in contact with the yoke, of a magnet formed by a solid cylinder of radius R and of thickness L perforated by a hole of radius r which passes through the entire thickness of the magnet. It has been established that the induction cancels itself out at a point from the axis OZ located at a distance of 1.6 mm from the side of the magnet in contact with the yoke.

The curve (33) represents a variation of $B/B_r$ as a function of the distance, of a magnet formed by a solid cylinder of radius R and of thickness L perforated by a cavity of radius r with depth l. It has been established that the induction is canceled at a point from the OZ axis located at a distance of 0.5 mm from the side of the magnet in contact with the yoke.

For a given variation of distance of the tooth made of soft magnetic material, the modulation of B which is produced with the perforated magnet is practically identical to that which is obtained with the solid magnet, when the volume of the hole is very small versus the volume of the magnet.

On the contrary, the average value of the induction is quite different. It is very low with the magnet perforated with a small hole, almost zero. This allows one to measure the induction B simply with an integrated circuit that includes a Hall-effect gaussmeter which is sensitive to low inductions on the order of 0 to ±20 mT, such as the integrated circuits of the TLE 4904 and 4905 type made by the SIEMENS company, and not in a more expensive way with two probes that are several millimeters distant, by which one measures the difference of the signals.

For an average null value of induction, a variation of temperature or of quality of the magnet, or even of magnetization (which influences $B_r$) the average value does not change at all. Only the amplitude of the modulation changes. This characteristic allows great manufacturing tolerances without it being necessary to resort to differential probes. The average value is determined only by the geometry of the system. In the case in which the average value is low but not zero, the influence of a variation of temperature or of quality of the magnet remains negligible.

A good adaptation of the magnet with the integrated circuit connected to the Hall-effect gaussmeter is in demand, so that the average value of the measured field would be very close to the average value of the alternating field. For this purpose one of the solutions consists in adjusting the magnet by means of laser firing along the OZ axis, by the rear area of the magnet when the integrated circuit and the probe are in operation. It is therefore possible to obtain good performance without having to resort to integrated circuits with alternating points located within very narrow tolerances.

That is, as noted above the "zero gauss" value is due to a cavity in the magnet. One further feature of the present application is to utilize a laser trimming operation to create an additional cavity, on the back of a magnet, that provides the same "zero gauss" function, but which is adjusted for each sensor depending on the assembly and tolerances on the position of the Hall-effect sensor and volume of the magnet.

Figure 9:
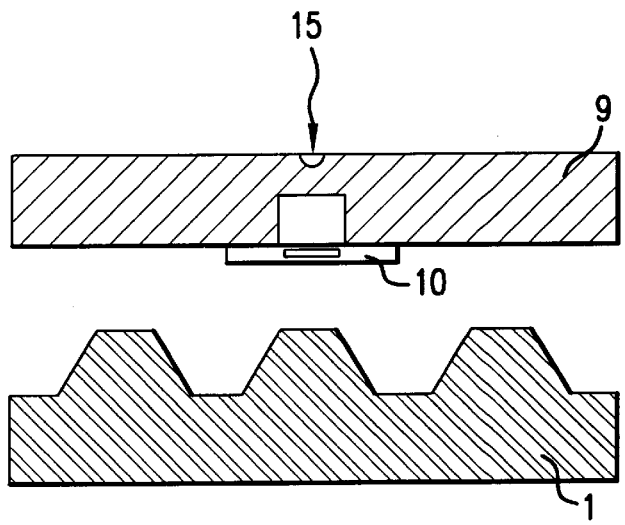
FIG. 9 represents a view of an operation in the present invention in which a magnet is laser trimmed.

More particularly, according to this further feature of the present invention, after assembly the sensor is tuned in order to bring induction on the Hall sensor to a desired value, which is dependent on the commutating point. As shown in FIG. 9, the present invention provides a laser tuning by generating a laser beam 15 to impinge on a yoke side of magnet 9 to thereby take off magnetic material on the yoke side of the magnet 9. By the present invention a hole can then be made with the use of the laser beam 15 that trims the surface of the magnet 9. While employing the laser trimming, an analog or digital output of the sensor must be checked in order to determine when the appropriate laser trimming amount has been reached.

The method of the present invention which is utilized to laser trim the sensor is a laser trimming which makes a "hole" on a yoke side of the magnet 9 by impinging laser beam 15 on this yoke side of magnet 9. With this operation, the laser beam 15 hits a back surface of the magnet 9 through the hole made in the yoke. One feature of this laser trimming is to find the "correct" trimming of the laser (voltage, pulse length, etc.).

Figure 10:
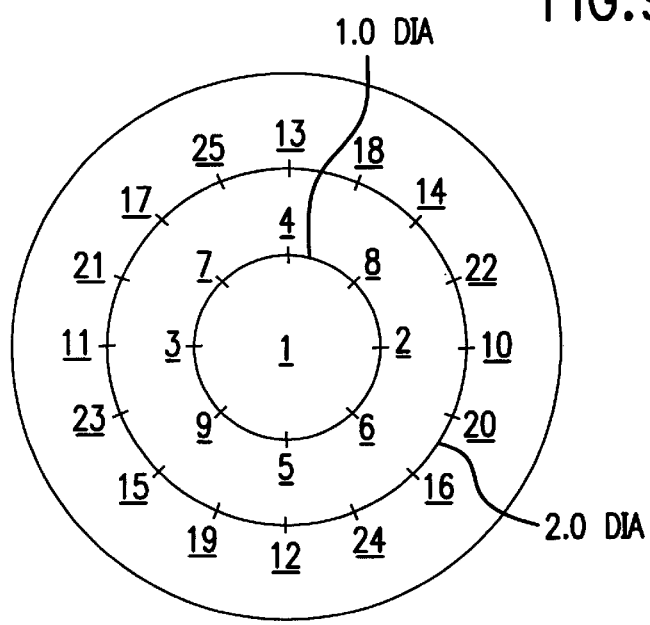
FIG. 10 shows one pattern that a laser trimming laser beam can follow on a magnet.

For the laser trimming operation, the laser beam 15 can be displaced in the hole as described in FIG. 10. As shown in FIG. 10, the laser beam 15 may be controlled to hit the magnet surface on two concentric circles, depicted in FIG. 10 as concentric circles with a diameter of 1.0 mm and with a diameter of 2.0 mm. This operation of the present invention initially shoots the laser beam 15 on predefined spots on the magnet, starting at the center of the circle (spot number 1) shown in FIG. 10 and then subsequently shooting on sequential spots 2, 3, etc., for as long as the output voltage of the Hall-effect sensor is different from a required voltage. When the output voltage of the Hall-effect sensor reaches the required voltage, the laser beam 15 is stopped and thereby the laser trimming operation is terminated.

It is important to choose a "correct" tuning for the laser beam 15 in order to shoot only once at the same place. This is the case because if it is necessary to make a second passage in the same shooting sequence, a second shot at the same place can create a crossing hole through the remaining magnet material and can destroy the Hall probe. It may also be necessary to adjust the "correct" power for the laser beam 15 to vaporize the magnet material and to remove the magnet material from the magnet hole. If the laser power is too low, a chip may be created which stays in the hole and which may move subsequently, which may result in a change in the sensor tuning. Further, an output from a laser source may be very "sharp" and will not be required to make a very cylindrical hole in a magnet. Further, and as noted above, if the laser beam 15 is shot twice at the same place a crossing hole can be undesirably created, which may destroy the Hall sensor.

In order to make a more defined hole in the magnet 9, it may be preferable not to shoot the laser beam 15 directly onto the magnet 9, but to carry the laser beam with an optic fiber that creates a more homogeneous laser beam. It may then become possible to shoot the laser beam twice at the same place on the magnet 9 without risking destroying the sensor.

Figure 11:
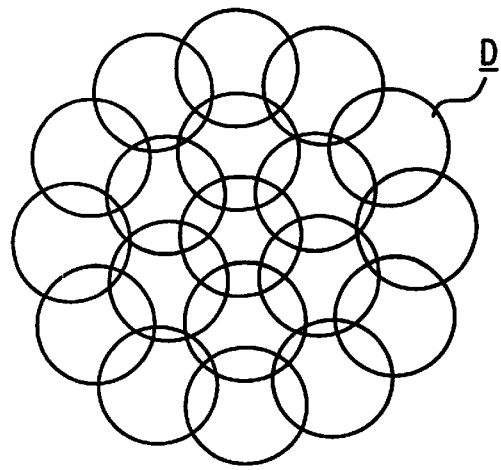
FIG. 11 shows a further pattern that a laser trimming laser beam can follow on a magnet.

A tuning sequence utilizing such an optic fiber can, as an example, follow the sequence shown in FIG. 11. With such a sequence a first shot to form a laser dot D is made into the center, see the center dot, and then two concentric circles of dots are then formed, for example of 1.4 mm and 2.8 mm diameter. In FIG. 11 the spot diameter may be 1 mm as an example. In this example of a firing dot sequence of laser beam 15 shown in FIG. 11, one spot is formed in the center, six spots are formed on the concentric circle of 1.4 diameter, and 12 spots are formed on the concentric circle of 28 mm diameter.

Figure 12:
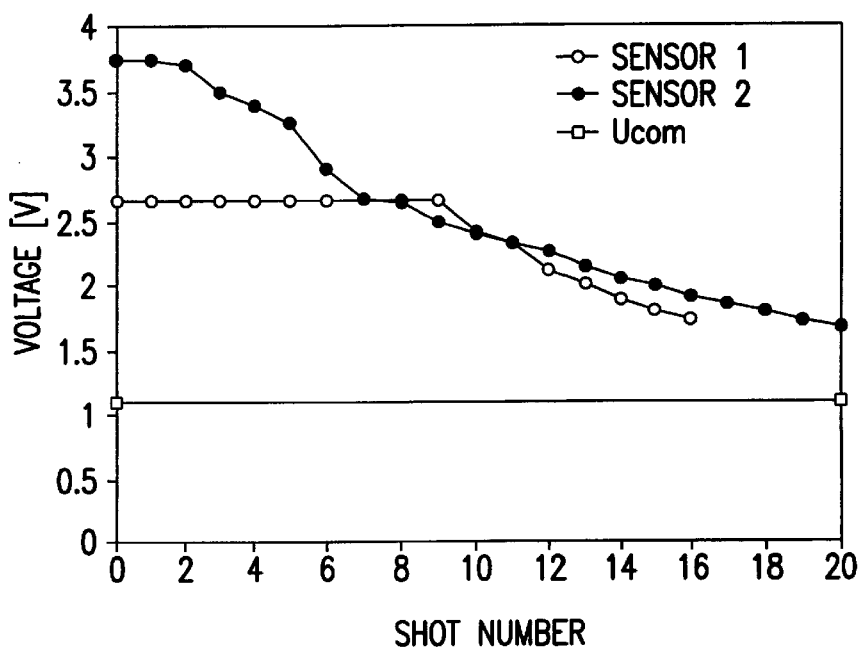
FIG. 12 show a sample of variations in sensor outputs during a laser trimming operation.

The laser trimming can be performed for an analog Hall-effect sensor as indicated in FIG. 12. In FIG. 12, an evolution of an analog signal in the Hall-effect sensor versus a number of shots of laser beam 15 for two different sensors onto the magnet 9 which are laser trimmed when the Hall-effect gaussmeter 10 is positioned in front of a tooth of toothed wheel 1 is detailed; the signal $U_{com}$ is a commutation level, which in front of a tooth of the magnet 9 the signal is over 1.1 volts, and in front of a hole of the magnet 9 the signal is below 1.1 volts.

In this way, FIG. 12 shows how the output of two different sensors can vary based on a number of shots of the laser beam 15 onto the yoke of the magnet 9, at a time at which the Hall-effect gaussmeter 10 is opposite to a tooth of the toothed wheel 1. FIG. 12 is provided to show an example of such a variation of an output voltage of the Hall-effect gaussmeter 10 based on the number of shots of the laser beam 15; the controlling of the shots of the laser beam 15 can in this way be used to control the amount of laser trimming to obtain an appropriate output voltage of the Hall-effect gaussmeter 10 when positioned opposite of a tooth of the toothed wheel 1.

Figure 13A:
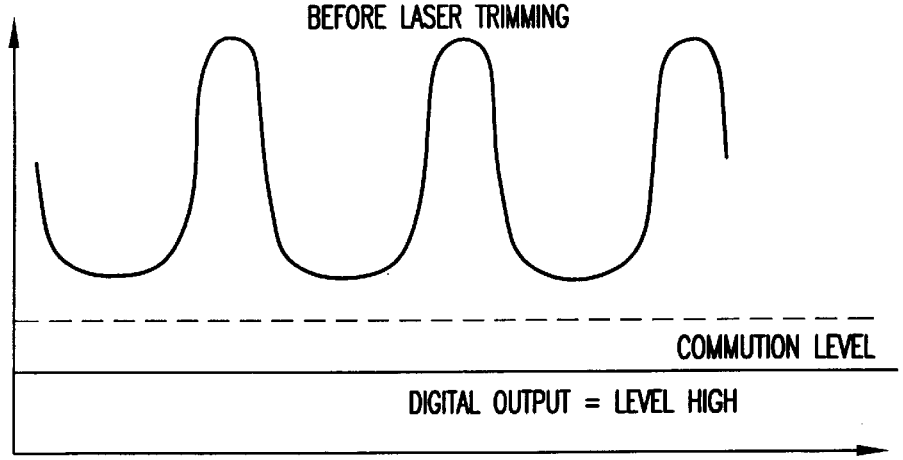
FIG. 13(a) shows an output of an analog signal before a laser trimming operation.
Figure 13B:
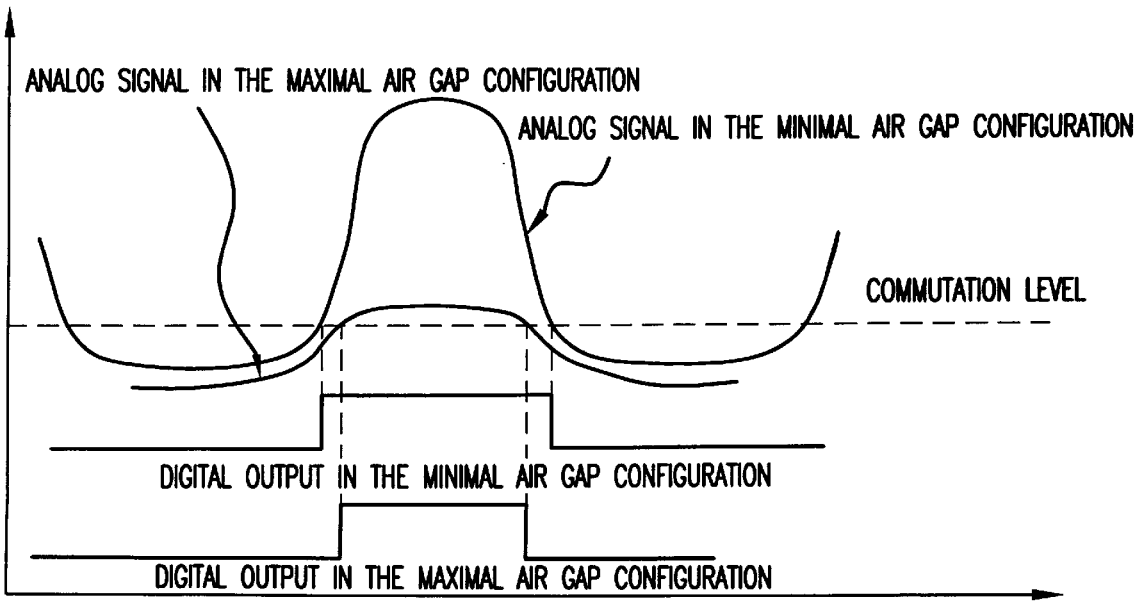
FIG. 13(b) shows an output in analog and digital sensors after a laser trimming operation as in the present invention.

The laser trimming can also be performed for a digital Hall-effect sensor, in addition to for an analog Hall-effect sensor, as shown in FIGS. 13(a) and 13(b). Before the laser trimming the commutation level is totally different from an analog signal read by the Hall-effect gaussmeter 10, which means that the digital output of the sensor is continuously high or low, as shown in FIG. 13(a). As shown in FIG. 13(b), as the laser trimming by laser beam 15 of the magnet 9 is performed, the minimal value of the signal decreases and finally crosses the chosen commutation level. The digital output then goes to oscillate between 1 and 0 with the duty cycle as shown in FIG. 13(b), which is dependent on the air gap configuration.

When the yoke is not perforated by a small hole in the OZ axis, adjustment is effected by vaporizing the soft magnetic material.

When the yoke is perforated by a small hole of transverse dimension, the dimension being at the greatest equal to that of the cavity, then the adjustment is made by vaporizing a small piece of the magnet. This solution is preferable in the case of a blind hole. For this purpose it is definitely necessary to provide a value in excess of the thickness l of the magnet at the bottom of the hole.

The invention is described in the preceding example in a circular configuration. It is easily understood that a person of the art could easily transpose the invention to a mode of linear implementation in which the teeth are aligned linearly. The moving component could also be implemented by a terminal rim perforated with rectangular holes.

What is claimed is:

1. A process for adapting a permanent magnet to an integrated circuit connected to a Hall probe of an incremental sensor comprising a moving component having at least one moving tooth in a direction OZ;

a permanent magnet formed opposite the moving component and being magnetized along the direction OZ approximately perpendicular to an OY axis;

a Hall probe sensitive to direction and strength of a magnetic field arranged in an air gap between the permanent magnet and the at least one moving tooth of the moving component so that an axis with greatest sensitivity is approximately oriented along the direction OZ;

wherein the Hall probe is located in proximity of a singular point of the direction OZ defined by a presence of a null field, at a point where an average value of the magnetic field along direction OZ during displacement of the moving component is approximately equal to a field which causes alternation of an integrated circuit that is connected to the Hall probe, and in that a plane of a Hall layer of the Hall probe is arranged between a front plane passing by a front side of the permanent magnet closest to the moving component and a parallel plane tangential to the moving component, at a distance from the front plane of the permanent magnet at least equal to a thickness of a protective envelope of the Hall layer;

wherein the permanent magnet is adjusted by using a laser along the direction OZ, at a rear area of the permanent magnet, when the integrated circuit and Hall probe are functioning.

2. The process according to claim 1, wherein the permanent magnet has a cavity located near an axis perpendicular to a displacement axis of the moving component passing by the Hall probe.

3. The process according to claim 2, wherein said cavity is a small hole.

4. The process according to claim 2, wherein the permanent magnet is comprised of a disk-shaped magnet perforated at least partially by said cavity.

5. The process according to claim 4, wherein the Hall probe is positioned on an ordinate z on the direction OZ so that induction $$B_{total}/B_r = B_{solid\ magnet}/B_r - B_{virtual\ magnet}/B_r + B_{plug\ magnet}/B_r$$

which is approximately equal to an oscillation value of the integrated electronic circuit connected to the Hall probe when the air gap increases, where:

$B_{total}$ is a component of an induction along direction OZ;

the origin O, beginning from which the distance z is measured, is located on a side of the permanent magnet closest to the at least one moving tooth;

$B_r$ designates residual induction;

$B_{solid\ magnet}$ designates induction of a first virtual magnet which is not perforated, cylindrical in particular, in which external dimensions correspond to external dimensions of the permanent magnet;

$B_{virtual\ magnet}$ designates induction of a second virtual magnet whose external dimensions correspond to internal dimensions of the cavity; and $B_{plug\ magnet}$ designates induction of a third virtual magnet whose section corresponds to an internal section of the cavity, and whose height corresponds to a difference between the permanent magnet and a depth of the cavity.

6. The process according to claim 2, wherein the Hall probe is positioned on an ordinate z on the OZ axis so that induction $$B_{alternating}/B_r \cong \frac{1}{2}\left[\frac{z+2L}{\sqrt{R^2+(z+2L)^2}} - \frac{z}{\sqrt{R^2+z^2}} - \frac{z+2L}{\sqrt{r^2+(z+2L)^2}} + \frac{z}{\sqrt{r^2+z^2}} + \frac{(z+2l)}{\sqrt{r^2+(z+2l)^2}} - \frac{z}{\sqrt{r^2+z^2}}\right]$$

where:

$B_{alternating}$ designates a value of an alternating field of the Hall probe;

l designates a difference between a thickness of the permanent magnet and a depth of the cavity (l is null in a case of a cavity which passes through the permanent magnet);

L designates a difference between the thickness of the permanent magnet in a case in which the permanent magnet is connected to a yoke, the yoke operating as a magnetic reflector, and if the permanent magnet is not connected to a yoke, the thickness of the permanent magnet is 2L;

z designates an ordinate of the Hall probe measured from an origin point located on a side of the permanent magnet opposite the at least one moving tooth;

R designates an external radius of the permanent magnet;

r designates a radius of the cavity.

7. The process according to claim 1, further comprising two parallel-piped magnets which are parallel and separated by a thin space of at most 1.8 mm provided between the two magnets and directed along an XOY plane.

8. The process according to claim 1, wherein the moving component is a toothed wheel.

9. The process according to claim 1, wherein the moving component is a rack.

10. The process according to claim 1, wherein the permanent magnet is a disk shaped magnet in which a ratio of the diameter to the thickness is between 4 and 7.

11. The process according to claim 10, wherein the permanent magnet is perforated by a disk-shaped magnet which includes a coaxial blind cavity whose diameter is between 0.8 and 1.8 mm.

12. The process according to claim 1, wherein the permanent magnet is an oriented Samarium-cobalt magnet with a plastic binder.

13. The process according to claim 2, wherein a volume of the cavity provided in the permanent magnet is less than 5% of a volume of the permanent magnet.

14. The process according to claim 1, wherein the permanent magnet and the Hall probe are integrated in a housing made of plastic fabricated by molding.

15. A process for forming a zero gauss value in an incremental sensor including a moving component having at least one moving tooth in a direction OZ, a permanent magnet formed opposite the moving component and being magnetized along the direction OZ approximately perpendicular to an OY axis, and a Hall probe sensitive to direction and strength of a magnetic field arranged in an air gap between the permanent magnet and the at least one moving tooth of the moving component so that an axis with greatest sensitivity is approximately oriented along the direction OZ, comprising the step of:

impinging a laser beam on the permanent magnet along the direction OZ to trim away a portion of the permanent magnetic when an integrated circuit connected to the Hall probe and the Hall probe are functioning such that the Hall probe is located in proximity of a singular point of the direction OZ defined by a presence of a null field, at a point where an average value of the magnetic field along direction OZ during displacement of the moving component is approximately equal to a field which causes alternation of the integrated circuit connected to the Hall probe, and in that a plane of a Hall layer of the Hall probe is arranged between a front plane passing by a front side of the permanent magnet closer to the moving component and a parallel plane tangential to the moving component, at a distance from the front plane of the permanent magnet at least equal to a thickness of a protective envelope of the Hall layer.

16. The process according to claim 15, wherein the laser beam is impinged along a pattern defining one central point and two concentric circles.

17. The process according to claim 16, wherein the first concentric circle includes a pattern of six to eight dots formed by the impinging of the laser beam.

18. The process according to claim 17, wherein the first concentric circle has a diameter from 1.0 to 1.4 mm.

19. The process according to claim 17, wherein the second concentric circle includes a pattern of twelve to sixteen dots formed by the impinging of the laser beam.

20. The process according to claim 19, wherein the second concentric circle has a diameter from 2.0 to 2.8 mm.

* * * * *